United States Patent
Liang

(10) Patent No.: US 11,145,372 B2
(45) Date of Patent: Oct. 12, 2021

(54) DECODING METHOD, MEMORY CONTROLLING CIRCUIT UNIT, AND MEMORY STORAGE DEVICE

(71) Applicant: PHISON ELECTRONICS CORP., Miaoli (TW)

(72) Inventor: Ming-Jen Liang, Hsinchu (TW)

(73) Assignee: PHISON ELECTRONICS CORP., Miaoli (TW)

(*) Notice: Subject to any disclaimer, the term of this patent is extended or adjusted under 35 U.S.C. 154(b) by 20 days.

(21) Appl. No.: 16/285,178

(22) Filed: Feb. 25, 2019

(65) Prior Publication Data

US 2020/0219567 A1    Jul. 9, 2020

(30) Foreign Application Priority Data

Jan. 7, 2019    (TW) ................. 108100512

(51) Int. Cl.
| | |
|---|---|
| G11C 16/08 | (2006.01) |
| G06F 3/06 | (2006.01) |
| G11C 16/26 | (2006.01) |
| G11C 16/14 | (2006.01) |
| G11C 16/24 | (2006.01) |
| G11C 11/56 | (2006.01) |
| G11C 16/04 | (2006.01) |

(52) U.S. Cl.
CPC ............ *G11C 16/08* (2013.01); *G06F 3/0604* (2013.01); *G06F 3/0659* (2013.01); *G06F 3/0679* (2013.01); *G11C 16/14* (2013.01); *G11C 16/26* (2013.01); *G11C 11/5671* (2013.01); *G11C 16/0483* (2013.01); *G11C 16/24* (2013.01)

(58) Field of Classification Search
None
See application file for complete search history.

(56) References Cited

U.S. PATENT DOCUMENTS

| | | | |
|---|---|---|---|
| 9,773,565 B1* | 9/2017 | Yeh ................... | G11C 16/26 |
| 2013/0064013 A1* | 3/2013 | Lee .................... | G11C 11/5628 |
| | | | 365/185.03 |
| 2013/0080858 A1* | 3/2013 | Lee .................... | G11C 16/349 |
| | | | 714/773 |
| 2013/0132652 A1* | 5/2013 | Wood .................. | G06F 3/0629 |
| | | | 711/103 |
| 2014/0040704 A1* | 2/2014 | Wu ..................... | G06F 11/1068 |
| | | | 714/773 |

(Continued)

*Primary Examiner* — Charles Rones
*Assistant Examiner* — Ryan Dare
(74) *Attorney, Agent, or Firm* — JCIPRNET

(57) ABSTRACT

The present invention provides a decoding method, a memory controlling circuit unit, and a memory storage device. The decoding method includes: receiving a plurality of commands; reading a first physical programming unit to obtain a plurality of first data respectively by using a plurality of first reading voltage groups of a plurality of reading voltage groups based on a first read command of the plurality of commands and executing a first decoding operation in each of the plurality of first data, wherein a number of the plurality of first reading voltage groups is less than a number of the plurality of reading voltage groups; and executing other commands being different from the first read command of the plurality of commands when unsuccessfully executing the first decoding operation for each of the plurality of first data.

12 Claims, 12 Drawing Sheets

(56) References Cited

U.S. PATENT DOCUMENTS

| | | | |
|---|---|---|---|
| 2018/0032282 A1* | 2/2018 | Hahn | G06F 3/0611 |
| 2018/0247695 A1* | 8/2018 | Kasai | G11C 16/10 |
| 2019/0129776 A1* | 5/2019 | Hsiao | G11C 16/3422 |
| 2019/0155546 A1* | 5/2019 | Cai | G06F 11/1068 |
| 2019/0378576 A1* | 12/2019 | Chen | G11C 29/028 |
| 2020/0035307 A1* | 1/2020 | Zeng | G11C 29/021 |
| 2020/0042237 A1* | 2/2020 | Zeng | G06F 3/0659 |

* cited by examiner

| lower physical programming unit | middle physical programming unit | upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

| reading voltage group | reading voltage |
|---|---|
| G1 | V1~V1N |
| G2 | V2~V2N |
| G3 | V3~V3N |
| G4 | V4~V4N |
| G5 | V5~V5N |
| ⋮ | ⋮ |
| Gx | VX~VXN |

FIG. 14

DECODING METHOD, MEMORY CONTROLLING CIRCUIT UNIT, AND MEMORY STORAGE DEVICE

CROSS-REFERENCE TO RELATED APPLICATION

This application claims the priority benefit of Taiwan application serial no. 108100512, filed on Jan. 7, 2019. The entirety of the above-mentioned patent application is hereby incorporated by reference herein and made a part of this specification.

BACKGROUND

Technical Field

The present invention relates to a decoding method, a memory controlling circuit unit, and a memory storage device.

Description of Related Art

The digital camera, the mobile phone and the MP3 players have grown very rapidly in the past few years so that the demand of the storage media for the consumers has also increased rapidly. Since the rewritable non-volatile memory module (e.g. a flash memory) has characteristics such as data non-volatile, power saving, small size, non-mechanical structure, etc., it is very suitable for being built into the various portable multimedia device exemplified above.

In general, when data is read from a rewritable non-volatile memory module by applying a reading voltage, the memory controlling circuit may decode read data to obtain the data to be read. However, when the read data is decoded unsuccessfully, the memory controlling circuit executes a retry-read mechanism to re-obtain another reading voltage, and the memory controlling circuit performs a read operation by applying the another reading voltage to re-obtain read data and decodes the read data. The memory controlling circuit executes the decoding operation as described above based on the verification bit being re-obtained to obtain another decoded data composed of a plurality of decoded bits. The abovementioned mechanism that to re-obtain the reading voltage for retry-read may be executed repeatedly until the number of times exceeds the preset number of times. When the number of times for the retry-read mechanism being executed exceeds the preset number of times, the memory controlling circuit, for example, may execute the decoding operation by using the other mechanisms which is not the retry-read mechanism.

It should be noted that when a decoding operation is executed for the data read out by a read command but the decoding operation (for example, a retry-read mechanism) is repeatedly executed due to decoding failures, all the read commands following the read command are forced to wait and cannot be performed. This situation will result in worse efficiency for executing read commands.

SUMMARY

The present invention provides a decoding method, a memory controlling circuit unit, and a memory storage device, which can reduce the waiting time taken for subsequent read commands to wait for a previous read command to execute a complete decoding operation.

The present invention provides a decoding method for a rewritable non-volatile memory module having a plurality of physical erasing units, each of the plurality of physical erasing units having a plurality of physical programming units, the decoding method includes: receiving a plurality of commands; reading a first physical programming unit to obtain a plurality of first data respectively by using a plurality of first reading voltage groups of a plurality of reading voltage groups based on a first read command of the plurality of commands and executing a first decoding operation in each of the plurality of first data, wherein a number of the plurality of first reading voltage groups is less than a number of the plurality of reading voltage groups; and executing other commands being different from the first read command of the plurality of commands when unsuccessfully executing the first decoding operation for each of the plurality of first data.

The present invention provides a memory controlling circuit unit for a rewritable non-volatile memory module having a plurality of physical erasing units, each of the plurality of physical erasing units having a plurality of physical programming units, the memory controlling circuit unit including a host interface, a memory interface, and a memory management circuit. A host interface is configured to couple to a host system. A memory interface is configured to couple to the rewritable non-volatile memory module. A memory management circuit is coupled to the host interface and the memory interface. The memory management circuit is configured to execute the following operations: receiving a plurality of command; reading a first physical programming unit to obtain a plurality of first data respectively by using a plurality of first reading voltage groups of a plurality of reading voltage groups based on a first read command of the plurality of commands and executing a first decoding operation in each of the plurality of first data, wherein a number of the plurality of first reading voltage groups is less than a number of the plurality of reading voltage groups; and executing other commands being different from the first read command of the plurality of commands when unsuccessfully executing the first decoding operation for each of the plurality of first data.

The present invention provides a memory storage device, and the memory storage device includes a connection interface unit, a rewritable non-volatile memory module, and a memory controlling circuit unit. The connection interface unit is configured to couple to a host system. The rewritable non-volatile memory module has a plurality of physical erasing units, and each of the plurality of physical erasing units having a plurality of physical programming units. The memory controlling circuit unit is coupled to the connection interface unit and the rewritable non-volatile memory module. The memory controlling circuit unit is configured to execute the following operations: receiving a plurality of commands; reading a first physical programming unit to obtain a plurality of first data respectively by using a plurality of first reading voltage groups of a plurality of reading voltage groups based on a first read command of the plurality of commands and execute a first decoding operation for each of the plurality of first data, wherein a number of the plurality of first reading voltage groups is less than a number of the plurality of reading voltage groups; and executing other commands being different from the first read command of the plurality of commands when the memory controlling circuit unit unsuccessfully executes the first decoding operation for each of the plurality of first data.

Based on the mentioned above, the decoding method, the memory controlling circuit unit and the memory storage device provided in the present invention may firstly suspend executing the decoding correspond to a certain read command when a portion of a retry-read mechanism for the data being read by the read command is executed and the portion of the retry-read mechanisms occurred failure and firstly execute the subsequent other commands of the read command firstly, thereby reducing the time taken by the subsequent command to wait for the previous read command to execute a complete decoding operation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 10 is a schematic diagram illustrating an example of a physical erasing unit according to the present embodiment.

FIG. 14 is a schematic diagram illustrating a plurality of reading voltage groups for the retry-read mechanism according to an embodiment.

DESCRIPTION OF THE EMBODIMENTS

In general, a memory storage device (also known as a memory storage system) includes a rewritable non-volatile memory module and a controller (also known as a controlling circuit). Usually the memory storage device is used with the host system so that the host system may write the data to the memory storage device or read the data from the memory storage device.

Figure 1:
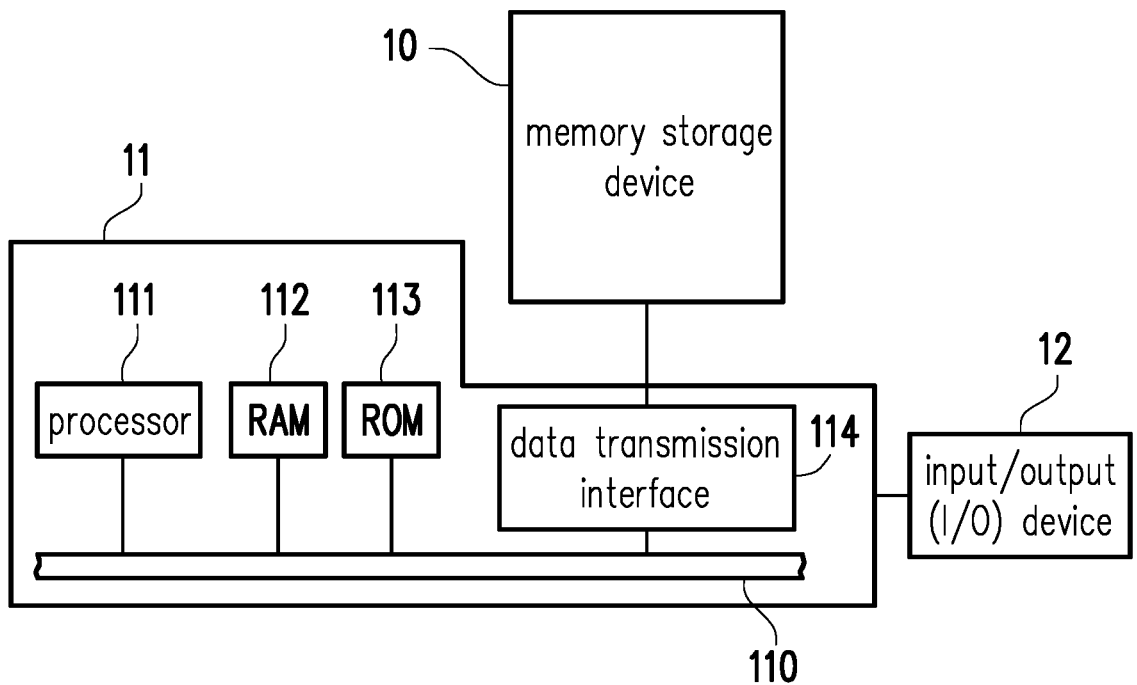
FIG. 1 is a schematic diagram illustrating a host system, a memory storage device and an input/output (I/O) device according to an embodiment of the present invention.
Figure 2:
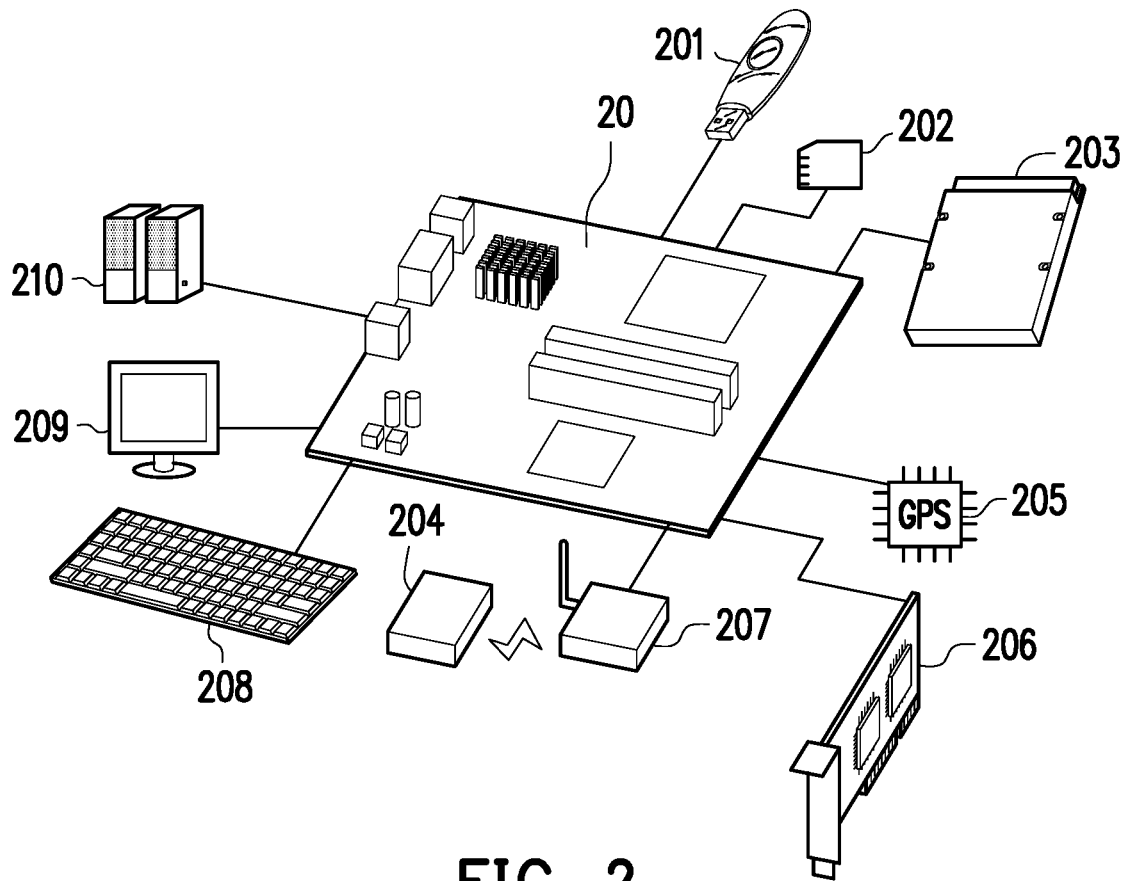
FIG. 2 is a schematic diagram illustrating a host system, a memory storage device, and an I/O DEVICE according to another embodiment of the present invention.

FIG. 1 is a schematic diagram illustrating a host system, a memory storage device and an input/output (I/O) device according to an embodiment of the present invention. FIG. 2 is a schematic diagram illustrating the host system, the memory storage device and the I/O device according to another embodiment of the present invention.

Please refer to FIG. 1 and FIG. 2, the host system 11 generally includes a processor 111, a random access memory (RAM) 112, a read only memory (ROM) 113, and a data transmission interface 114. All the processor 111, the RAM 112, the ROM 113, and the data transmission interface 114 are coupled to a system bus 110.

In this example embodiment, the host system 11 is coupled to the memory storage device 10 via the data transmission interface 114. For example, the host system 11 may store the data to the memory storage device 10 or read the data from the memory storage device 10 via the data transmission interface 114. In addition, the host system 11 is coupled to the I/O device 12 via the system bus 110. For example, the host system 11 may transmit an output signal to the I/O device 12 or receive an input signal from the I/O device 12 via the system bus 110.

In the present example embodiment, the processor 111, the RAM 112, the ROM 113 and the data transmission interface 114 may be disposed on the mainboard 20 in the host system 11. The number of the data transmission interfaces 114 may be one or more. Via the data transmission interface 114, the mainboard 20 may be coupled to the memory storage device 10 via wire or wireless method. The memory storage device 10 may be such as a flash disk 201, a memory card 202, a solid state driver (SSD) 203, or a wireless memory storage device 204. The wireless memory storage device 204 may be such as a near field communication (NFC) memory storage device, a Wi-Fi memory storage device, a Bluetooth memory storage device or a low power Bluetooth memory storage device (e.g. iBeacon), and it is a memory storage device based on various wireless communication technologies. In addition, the mainboard 20 may also be coupled to a global positioning system (GPS) module 205, a network interface card 206, a wireless transmission device 207, a keyboard 208, a screen 209, a horn 210 and the like via the system bus 110. For example, in an example embodiment, the mainboard 20 can access the wireless memory storage device 204 via the wireless transmission device 207.

Figure 3:
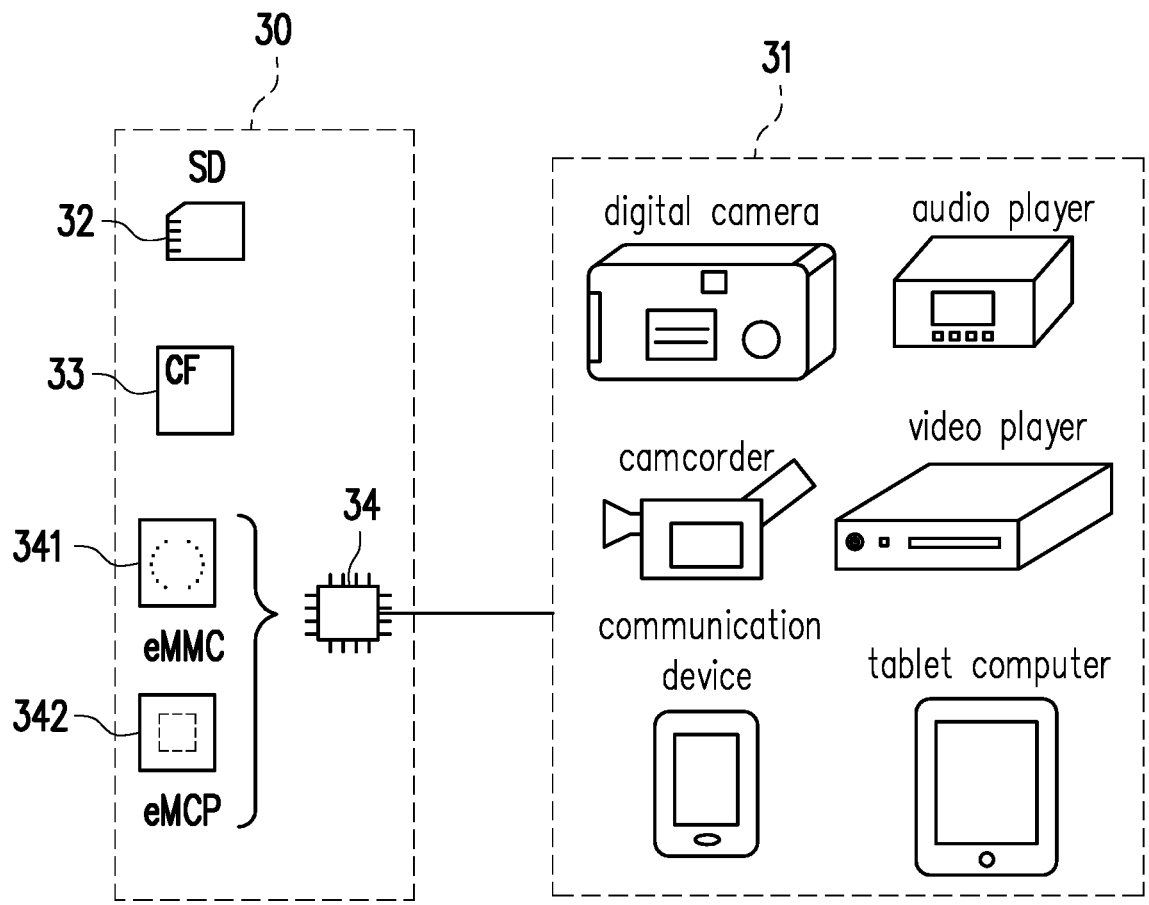
FIG. 3 is a schematic diagram illustrating a host system and a memory storage device according to another embodiment of the present invention.

In an example embodiment, the host system mentioned is any system that may be used with the memory storage device to store the data. Although the host system is exampled by the computer system to illustrate in the above example embodiment, FIG. 3 is a schematic diagram illustrating the host system and the memory storage device according to another embodiment of the present invention. Please refer to FIG. 3, in another example embodiment, the host system 31 may also be a system such as a digital camera, a camcorder, a communication device, an audio player, a video player or a tablet computer, and the memory storage device 30 may be various types of non-volatile memory storage devices such as a SD card 32, a CF card 33 or an embedded storage device 34 being used in the host system 31. The embedded storage device 34 includes various types of embedded storage device such as embedded multimedia card (embedded MMC, eMMC) 341 and/or embedded multi-chip package (embedded Multi Chip Package, eMCP) storage device 342 which is configured to directly coupled to the memory module and the embedded storage device on the substrate of the host system.

Figure 4:
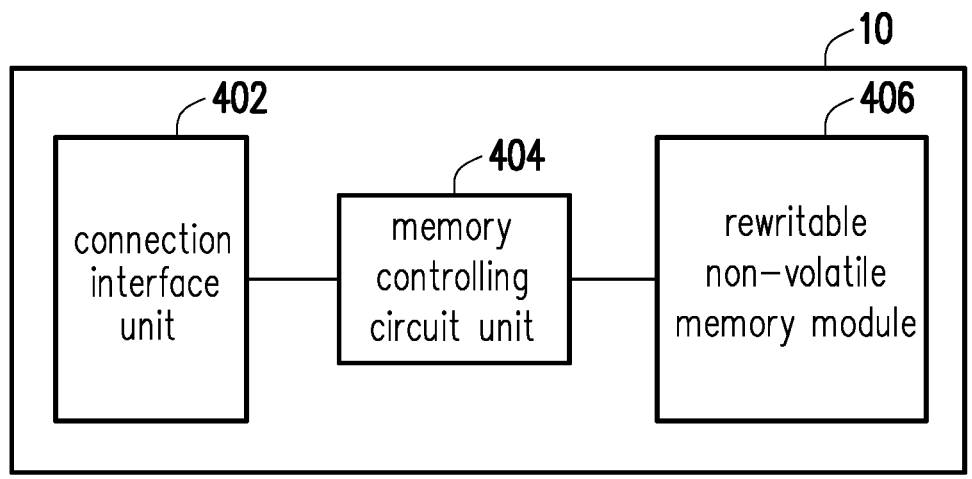
FIG. 4 is a schematic block diagram illustrating a memory storage device according to an embodiment of the present invention.

FIG. 4 is a schematic block diagram illustrating a memory storage device according to an example embodiment of the present invention.

Please refer to FIG. 4, the memory storage device 10 includes a connection interface unit 402, a memory controlling circuit unit 404, and a rewritable non-volatile memory module 406.

In this example embodiment, the connection interface unit 402 is compatible with Serial Advanced Technology Attachment (SATA) standard. However, it must be understood that the present invention is not limited to this, the connection interface unit 402 may also accord with Parallel Advanced Technology Attachment (PATA) standard, Institute of Electrical and Electronics Engineers (IEEE) 1394 standard, high speed Peripheral Component Interconnect Express (PCI Express) standard, Universal Serial Bus (USB) standard, Secure Digital (SD) interface standard, Ultra High Speed-I (UHS-I) interface standard, Ultra High Speed II (UHS-II) interface standard, Memory Stick (MS) interface standard, Multi-chip Package interface standard, Multi Media Card (MMC) interface standard, Embedded Multimedia Card (eMMC) interface standard, Universal Flash Storage (UFS) interface standard, embedded Multi-Chip package (eMCP) interface standard, Compact Flash (CF) interface standard, Integrated Drive Electronics (IDE) standard or other suitable standard. The connection interface unit 402 may be packaged in a wafer with the memory controlling circuit unit 404, or the connection interface unit 402 may be disposed outside a wafer that is contained in the memory controlling circuit unit 404.

The memory controlling circuit unit 404 is configured to execute a plurality of logic gates or control commands implemented in a hardware type or a firmware type and process the data writing, reading and erasing operations in the rewritable non-volatile memory module 406 based on the command of the host system 11.

The rewritable non-volatile memory module 406 is coupled to the memory controlling circuit unit 404 and is configured to store the data which being written by the host system 11. The rewritable non-volatile memory module 406 can be a single-level cell (SLC) NAND type flash memory module (i.e. a flash memory module may store one bit in one memory cell), a multi-level cell (MLC) NAND Type flash memory module (i.e. a flash memory module may store two bits in one memory cell), triple-level cell (TLC) NAND type flash memory module (i.e. a flash memory module may store three bits in one memory cell), the other flash memory module or the other memory module with the same characteristic.

The memory cell in the rewritable non-volatile memory module 406 is disposed by model of the array. The following describes the memory cell array in two dimensional arrays. However, it should be noted here that the following example embodiment is just an example of a memory cell array. In other examples embodiment, the configuration of the memory cell array can be adjusted to meet practical requirements.

Figure 5:
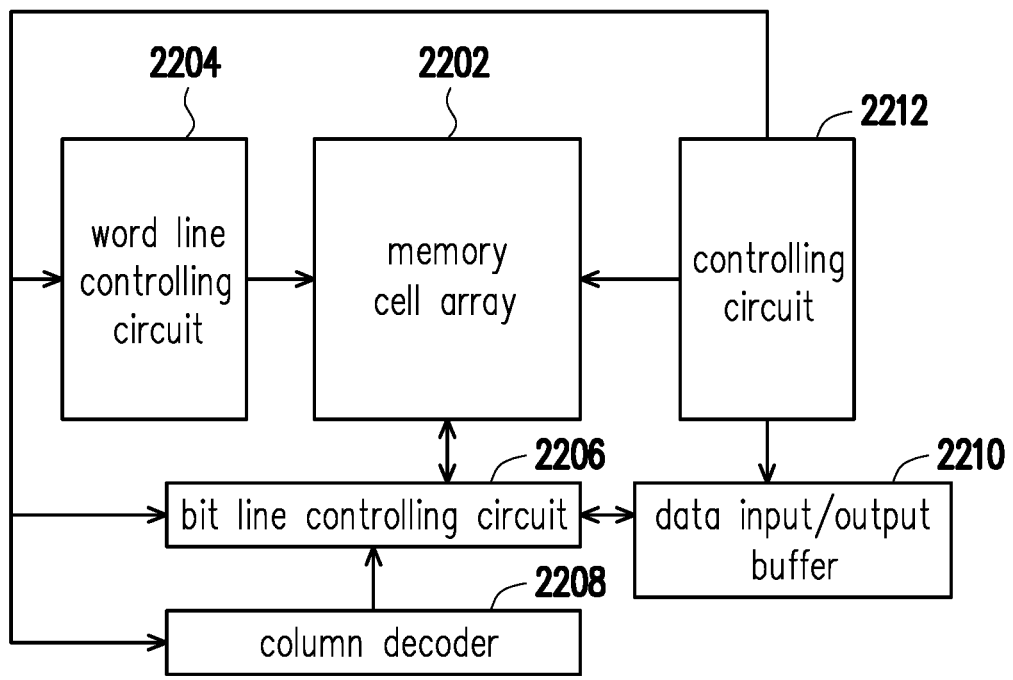
FIG. 5 is a schematic block diagram illustrating a rewritable non-volatile memory module according to an embodiment.
Figure 6:
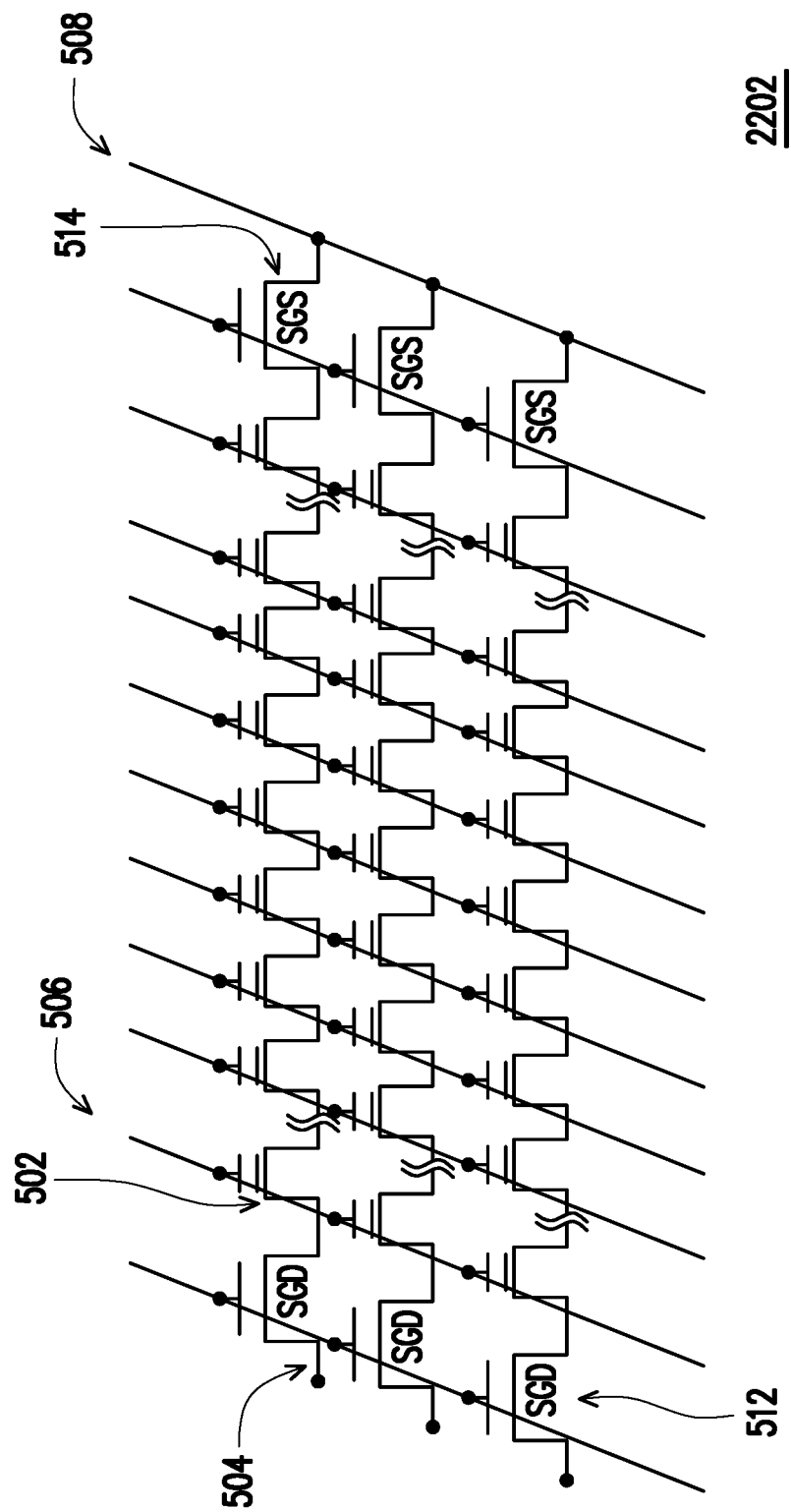
FIG. 6 is a schematic diagram illustrating a memory cell array according to an embodiment.

FIG. 5 is a schematic block diagram illustrating a rewritable non-volatile memory module according to an embodiment. FIG. 6 is a schematic diagram illustrating a memory cell array according to an embodiment.

Please refer to FIG. 5 and FIG. 6 simultaneously; the rewritable non-volatile memory module 406 includes a memory cell array 2202, a word line controlling circuit 2204, a bit line controlling circuit 2206, a column decoder 2208, a data input/output buffer 2210 and a controlling circuit 2212.

In this example embodiment, the memory cell array 2202 may include a plurality of memory cells 502 configured to store the data, a plurality of select gate drain (SGD) transistors 512 and a plurality of select gate source (SGS) transistors 514, and connection lines that connects to such memory cells. The connection lines include a plurality of bit lines 504, a plurality of word lines 506, and common source line 508 (as shown in FIG. 6). The memory cell 502 is disposed at the intersection of the bit line 504 and the word line 506 by model of the array (or by model of a stereoscopic stacking). The controlling circuit 2212 may control the word line controlling circuit 2204, the bit line controlling circuit 2206, the column decoder 2208, and the data input/output buffer 2210 to write the data to the memory cell array 2202 or read the data from the memory cell array 2202 when the memory controlling circuit unit 404 receives the write command or read command, wherein the word line controlling circuit 2204 is configured to control the voltage applied to the word line 506, the bit line controlling circuit 2206 is configured to control the voltage applied to the bit line 504, the column decoder 2208 selects the corresponding bit line based on the column address in the command, and the data input/output buffer 2210 is configured to temporarily store the data.

The memory cell in the rewritable non-volatile memory module 406 stores multiple bits by changing a critical voltage. Specifically, there is a charge trapping layer between the control gate and the channel each memory cell. By applying a writing voltage to the control gate so that the amount of electrons in the charge trapping layer may be changed, thus the critical voltage of the memory cell is changed. This procedure of changing the critical voltage is also called "writing the data to the memory cell" or "the programmable memory cell". As the critical voltage is changed, each memory cell of the memory cell array 2202 has a plurality of storage states. And the memory cell may be determined to belong to which the storage state by the reading voltage, thereby the bit stored by the memory cell is obtained.

Figure 7:
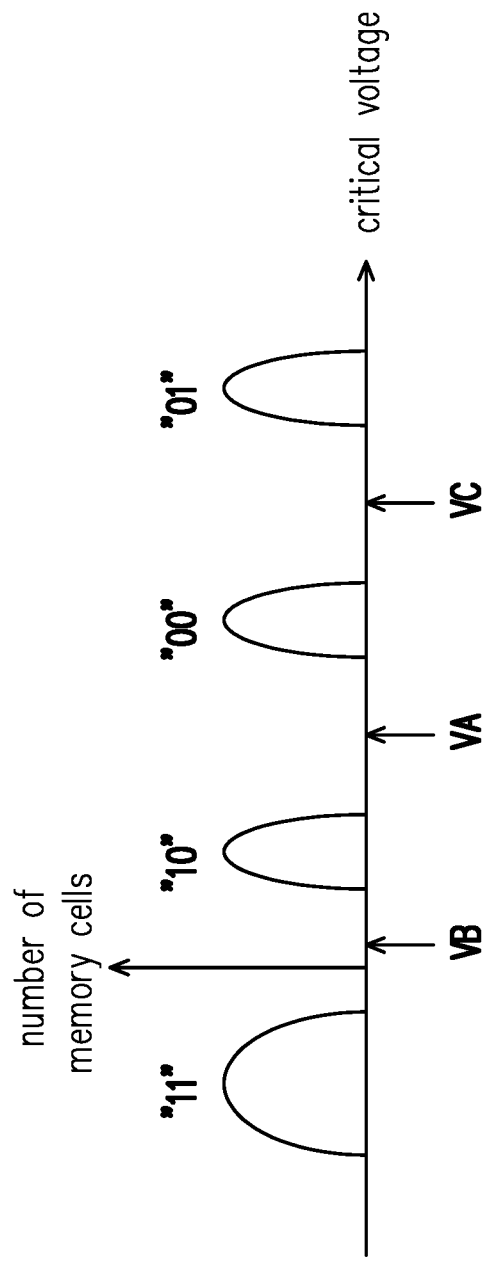
FIG. 7 is a statistical distribution diagram illustrating the gate voltage corresponding to the write data stored in the memory cell array according to an embodiment.

FIG. 7 is a statistical distribution diagram illustrating the gate voltage corresponding to the write data stored in the memory cell array according to an embodiment.

Please refer to FIG. 7, taking the MLC NAND type flash memory as an example, each memory cell has four storage states with different threshold voltages, and these storage states are respectively represented as "11", "10", "00" and "01". In other words, each storage state includes a least significant bit (LSB) and a most significant bit (MSB). In this example embodiment, the first bit calculated from the left side in the storage state (i.e. "11", "10", "00", and "01") is the LSB, and the second bit calculated from the left side is the MSB. Therefore, in this example embodiment, each memory cell can store 2 bits. It must be understood that the correspondence between the critical voltages and theirs storage states illustrated in FIG. 7 is just an example. In another example embodiment of the present invention, the correspondence between the critical voltages and the storage states may be arranged in "11", "10", "01", and "00" in accordance with the critical voltage from small to large or the other arrangements. Further, in another example embodiment, the first bit from the left side may be defined as the MSB, and the second bit from the left side may be defined as the LSB.

In an example embodiment which a memory cell can store a plurality of bits (e.g. MLC or TLC NAND flash memory module), the physical programming units that belong to the same word line may be classified into at least a lower physical programming unit and an upper physical programming unit. For instance, in the MLC NAND flash memory module, the least effective bit (LSB) of a memory cell belongs to the lower physical programming unit, and the most significant bit (MSB) of this memory cell belongs to the upper physical programming unit. In an example embodiment, the lower physical programming unit is also referred to as a fast page, and the upper physical programming unit is also referred to as a slow page. Furthermore, in the TLC NAND flash memory module, the least effective bit (LSB) of a memory cell belongs to the lower physical programming unit, the center significant bit (CSB) of this memory cell belongs to the middle physical programming unit, and the most significant bit (MSB) of this memory cell belongs to the upper physical programming unit.

Figure 8:
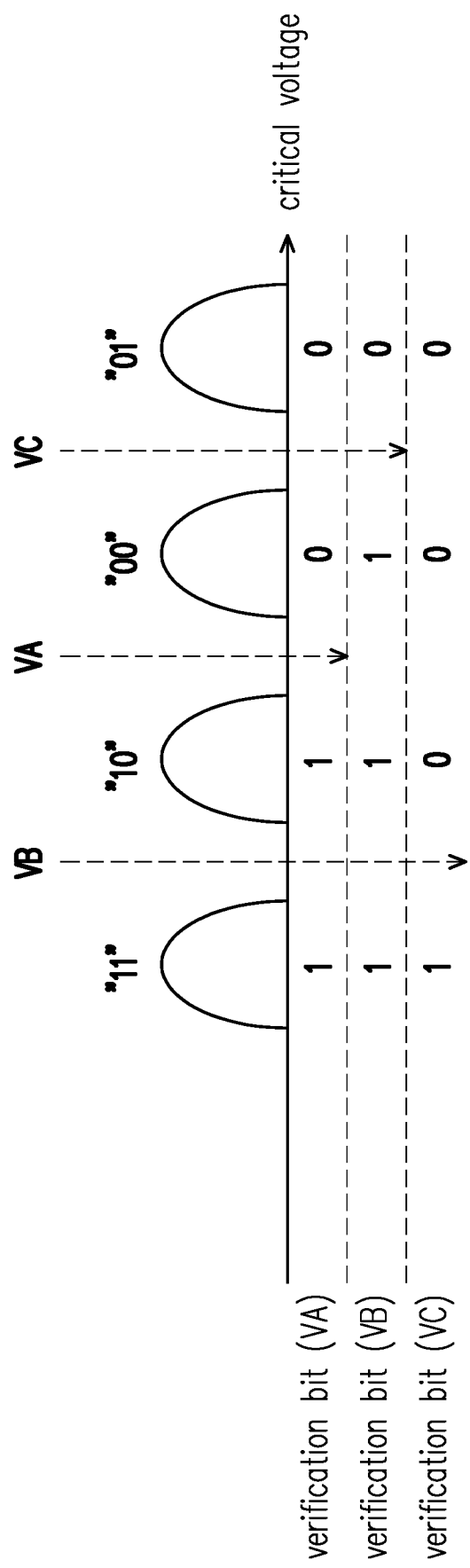
FIG. 8 is a schematic diagram illustrating reading the data from a memory cell according to an embodiment.

FIG. 8 is a schematic diagram illustrating reading the data from a memory cell according to an embodiment, which is an example of the MLC NAND type flash memory.

Please refer to FIG. 8, the reading operation of the memory cell of the memory cell array 2202 is executed by applying the reading voltage VA~VC to the control gate, and the data stored of the memory cell is identified by the conduction state of the memory cell channel. A verification bit (VA) is configured to indicate whether the memory cell channel is conducted when the reading voltage VA is applied; a verification bit (VC) is configured to indicate whether the memory cell channel is conducted when the reading voltage VC is applied; and a verification bit (VB) is configured to indicate whether the memory cell channel is conducted when the reading voltage VB is applied. It is assumed here that the verification bit is "1" to indicate that the corresponding memory cell channel is conducted, and the verification bit is "0" to indicate that the corresponding memory cell channel is not conducted. As shown in FIG. 8, the memory cell may be determined to belong to which the storage state by the verifying bit (VA)~the verifying bit (VC), it can be determined which storage state the memory cell is in, and then the stored bit is obtained.

Figure 9:
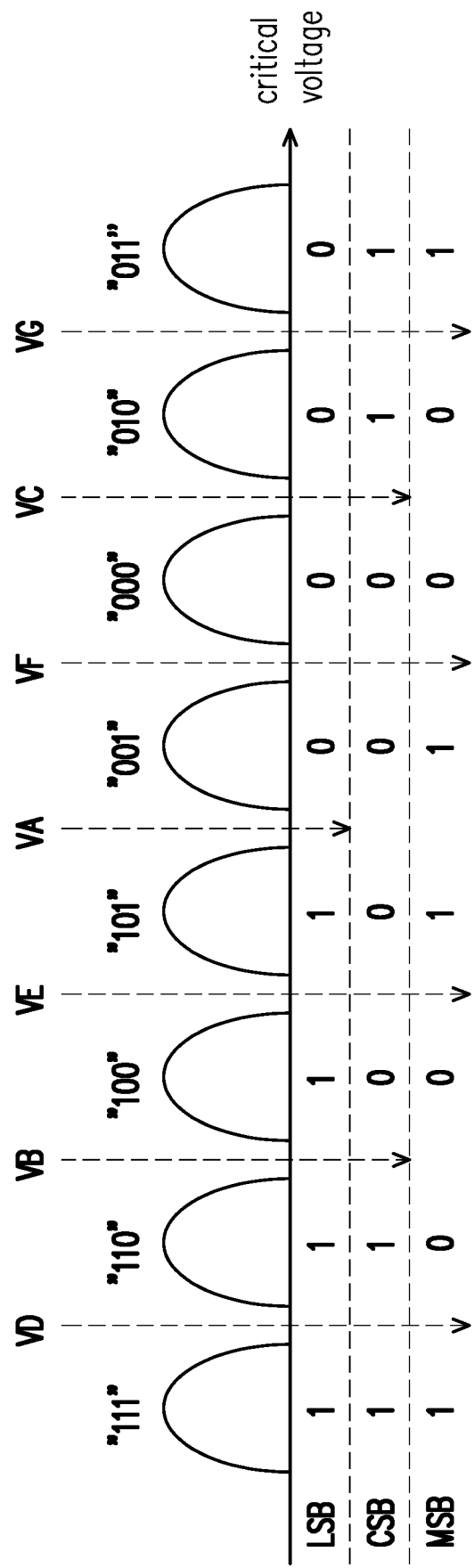
FIG. 9 is a schematic diagram illustrating reading the data from a memory cell according to another embodiment.

FIG. 9 is a schematic diagram illustrating reading the data from a memory cell according to another embodiment.

Please refer to FIG. 9, taking a TLC NAND type flash memory as an example, each storage state includes the least effective bit (LSB) that is the first bit calculated from the left side in the storage state, the center significant bit (CSB) that is the second bit calculated from the left side in the storage state, and the most effective bit (MSB) that is the third bit calculated from the left side in the storage state. In this example, based on the different critical voltages, the memory cell has 8 storage states (i.e. "111", "110", "100", "101", "001", "000", "010" and "011"). The bits stored in the memory cell may be determined by applying reading voltages VA~VG to the control gate.

It should be noted that the arrangement sequence of the eight storage states in FIG. 9 may be customized according to the design of the manufacturer, and is not limited to the arrangement of the example.

Furthermore, the memory cell of the rewritable non-volatile memory module 406 may constitute a plurality of physical programming units, and the physical programming units may constitute a plurality of erasing units. Specifically, the memory cell on the same word line in FIG. 6 may constitute one or more physical programming units. For example, if the rewritable non-volatile memory module 406 is the MLC NAND type flash memory module, the memory cell at the intersection of the same word line and the multiple bit lines may constitute two physical programming units, that is, the upper physical programming unit and the lower physical programming unit. One upper physical programming unit and one lower physical programming unit may be collectively referred to as a physical programming unit group. In particular, if the data read is in the lower physical programming unit of the physical programming unit group, the reading voltage VA in FIG. 8 may be used to identify the value of each bit in the lower physical programming unit. If the data read is in the upper physical programming unit of a physical programming unit group, the reading voltage VB and the reading voltage VC in FIG. 8 may be used to identify the value of each bit in the upper physical programming unit.

Alternatively, if the rewritable non-volatile memory module 406 is the TLC NAND type flash memory module, the memory cell at the intersection of the same word line and the multiple bit lines may constitute three physical programming units, that is, the upper physical programming unit, the middle physical programming unit and the lower physical programmable unit. The upper physical programming unit, the middle physical programming unit and the lower physical cal programming unit may be collectively referred to as a physical programming unit group. In particular, if the data read is in the lower physical programming unit of the physical programming unit group, the reading voltage VA in FIG. 9 may be used to identify the value of each bit in the lower physical programming unit. If the data read is in the middle physical programming unit of the physical programming unit group, the reading voltage VB and reading voltage VC in FIG. 9 may be used to identify the value of each bit in the middle physical programming unit. If the data read is in a upper physical programming unit of the physical programming unit group, the reading voltage VD, reading voltage VE, reading voltage VF and reading voltage VG in FIG. 9 may be used to identify the value of each bit in the upper physical programming unit.

In this example embodiment, the physical programming unit is the minimum unit that is programmable. That is, the physical programming unit is the minimum unit written the data to. For example, the physical programming unit is a physical page or a physical sector. If the physical programming unit is the physical page, then these physical programming units usually include a data bit zone and a redundancy bit zone. The data bit zone contains a plurality of physical sectors and the data bit zone is configured to store the user data, and the redundant bit zone is configured to store the system data (e.g. the error correction code). In this example embodiment, the data bit zone contains 32 physical sectors, and the size of one physical sector is 512 byte (B). However, in the other example embodiment, the data bit zone may also contain 8, 16, or greater or lesser number of physical sectors, and each of the physical sectors may also be larger or smaller in size. On the other hand, the physical erasing unit is the smallest unit for erasing. That is, each physical erasing unit contains the smallest numbers of the memory cells that are erased. For example, the physical erases unit is a physical block.

FIG. 10 is a schematic diagram illustrating an example of a physical erasing unit according to the present embodiment.

Please refer to FIG. 10, in this example embodiment, it is assumed that one physical erasing unit is composed of a plurality of physical programming unit groups, wherein each of the physical programming unit groups includes the lower physical programming unit, the middle physical programming unit and the upper physical programming unit, and these physical programming units are composed of a plurality of memory cells arranged on the same word line. For example, in physical erasing unit, the 0th physical programming unit that is belonged to the lower physical programming unit, the 1st physical programming unit that is belonged to the middle physical programming unit and the 2nd physical programming unit that is belonged to the upper physical programming unit are considered to one physical programming unit group. Similarly, the 3rd, 4th and 5th physical programming units are considered to one physical programming unit group, and so on. Other physical programming units are also classified into the plurality of physical programming unit groups by this way.

Figure 11:
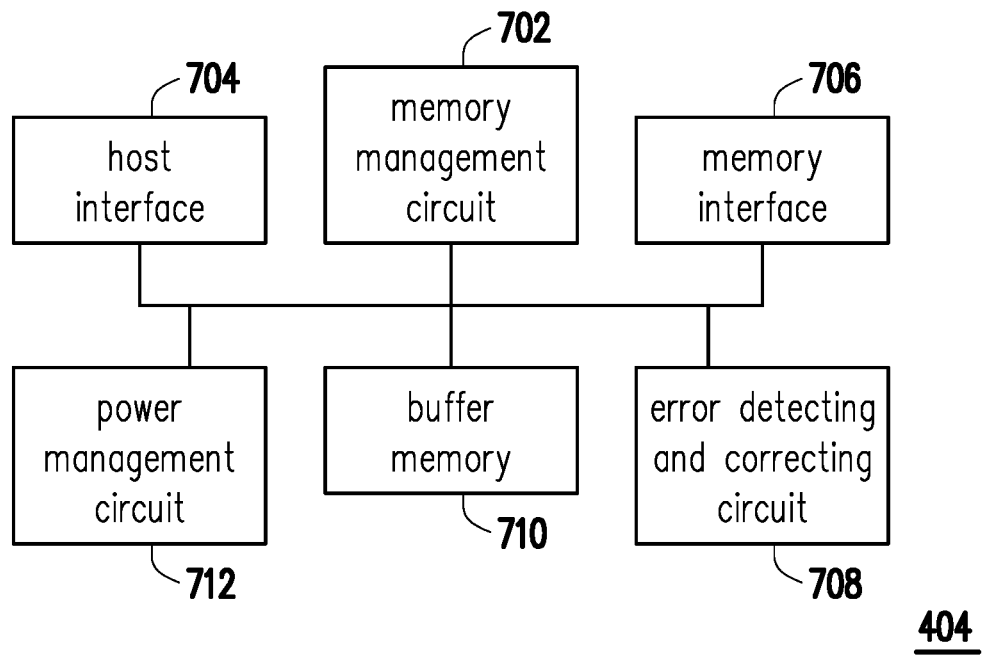
FIG. 11 is a schematic block diagram illustrating a memory controlling circuit unit according to an embodiment of the present invention.

FIG. 11 is a schematic block diagram illustrating a memory controlling circuit unit according to an embodiment of the present invention.

Please refer to FIG. 11, the memory controlling circuit unit 404 includes a memory management circuit 702, a host interface 704, a memory interface 706, and an error detecting and correcting circuit 708.

The memory management circuit 702 is configured to control the overall operation of the memory controlling circuit unit 404. Specifically, the memory management circuit 702 has a plurality of control commands, and the control commands may be executed to process the data writing, reading and erasing operations when the memory storage device 10 is in operation. The operation of the memory management circuit 702 or any of the circuit element included in the memory controlling circuit unit 404 is equivalent to the operation of the memory controlling circuit unit 404.

In this example embodiment, the control commands of the memory management circuit 702 are implemented in the form of firmware. For example, the memory management circuit 702 has a microprocessor unit (not shown) and a ROM (not shown), and the control commands of the memory management circuit 702 are burned into the ROM. When the memory storage device 10 is in operation, the control commands are executed by the microprocessor unit to process the data writing, reading and erasing operations.

In another example embodiment, the control commands of the memory management circuit 702 may also be stored in a specific area of the rewritable non-volatile memory module 406 (e.g. a system area that specially stores the system data in the memory module). In addition, the memory management circuit 702 has the microprocessor unit (not shown), the ROM (not shown), and a RAM (not shown). In particular, the ROM has a boot code, and the microprocessor unit may firstly execute the boot code to load the control commands stored in the rewritable non-volatile memory module 406 to the RAM of the memory management circuit 702 when the memory controlling circuit unit 404 is enabled. After that, the microprocessor unit will execute these control commands to process the data writing, reading and erasing operations.

In addition, in another example embodiment, the control commands of the memory management circuit 702 may also be implemented in the form of hardware. For example, the memory management circuit 702 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory cell management circuit is configured to manage the memory cells of the rewritable non-volatile memory module 406 or the group thereof. The memory writing circuit is configured to give a sequence of the write commands for the rewritable non-volatile memory module 406 to write the data into the rewritable non-volatile memory module 406. The memory reading circuit is configured to give a sequence of the read commands for the rewritable non-volatile memory module 406 to read the data from the rewritable non-volatile memory module 406. The memory erasing circuit is configured to give a sequence of the erasing commands for the rewritable non-volatile memory module 406 to erase the data from the rewritable non-volatile memory module 406. The data processing circuit is configured to process the data that is written into the rewritable non-volatile memory module 406 and the data that is read from the rewritable non-volatile memory module 406. The sequence of the write commands, the sequence of the read commands and the sequence of the erasing command sequence may respectively include one or more program codes or command codes, and they are respectively configured to instruct the rewritable non-volatile memory module 406 to process the corresponding writing, reading and erasing operations. In an example embodiment, the memory management circuit 702 may also give a sequence of the other types of commands to the rewritable non-volatile memory module 406 to indicate that the corresponding operation is executed.

The host interface 704 is coupled to the memory management circuit 702 and configured to receive and identify the commands and data transmitted by the host system 11. That is, the commands and data transmitted by the host system 11 are transmitted to the memory management circuit 702 via the host interface 704. In this example embodiment, the host interface 704 is compatible with the SATA standard. However, it must be understood that the present invention is not limited to this, the host interface 704 may also be compatible with PATA standard, IEEE 1394 standard, PCI Express standard, USB standard, SD standard, UHS-I standard, UHS-II standard, MS standard, MMC standard, eMMC standard, UFS standard, CF standard, IDE standard or the other suitable data transmission standard.

The memory interface 706 is coupled to the memory management circuit 702 and configured to access the rewritable non-volatile memory module 406. That is, the data that is written to the rewritable non-volatile memory module 406 is converted to a format that is acceptable to the rewritable non-volatile memory module 406 via the memory interface 706. Specifically, if the memory management circuit 702 will access the rewritable non-volatile memory module 406, the memory interface 706 will transmit the sequences of the corresponding commands. For instance, these sequences of the commands may include the sequence of the write commands indicating the writing data, the sequence of the read commands indicating the reading data, the sequence of the erasing commands indicating the erasing data, and a sequence of the corresponding commands indicating various memory operations (e.g. changing a level of the reading voltage, executing a procedure of the garbage collection, etc.). For example, these sequences of the commands are generated from the memory management circuit 702 and transmitted to the rewritable non-volatile memory module 406 via the memory interface 706. These sequences of the commands may include one or more signals, or the data on the bus. The signals or data may include the command codes or the program codes. For example, in the sequence of the read command, it will include the information such as the reading ID, the reading memory address, etc.

The error detecting and correcting circuit 708 is coupled to the memory management circuit 702 and configured to execute an error check and correction procedure to ensure the correctness of the data. Specifically, when the memory management circuit 702 receives the write command from the host system 11, the error detecting and correcting circuit 708 generates a corresponding error correcting code (ECC) and/or a corresponding error detection code (EDC) for the data corresponding to the write command, and the memory management circuit 702 may write the data corresponding to the write command and the corresponding error correction code and/or the corresponding error checking code into the rewritable non-volatile memory module 406. After that, when the memory management circuit 702 reads the data from the rewritable non-volatile memory module 406, the error correction code and/or the error checking code corresponding to the data may be read simultaneously, and the error detecting and correcting circuit 708 executes the error check and calibration procedure for the data read based on the error correction code and/or the error checking code.

In an example embodiment, the memory controlling circuit unit 404 further includes a buffer memory 710 and a power management circuit 712.

The buffer memory 710 is coupled to the memory management circuit 702 and configured to temporarily store the data and the commands from the host system 11 or the data from the rewritable non-volatile memory module 406. The power management circuit 712 is coupled to the memory management circuit 702 and configured to control the power source of the memory storage device 10.

It is noted that in the following description, some terms may be replaced with corresponding abbreviations for ease of reading (see Table 1).

TABLE 1

| rewritable non-volatile memory module | RNVM module |
|---|---|
| physical programming unit | PPU |
| physical erasing unit | PEU |
| memory management circuit | MMC |

Figure 12:
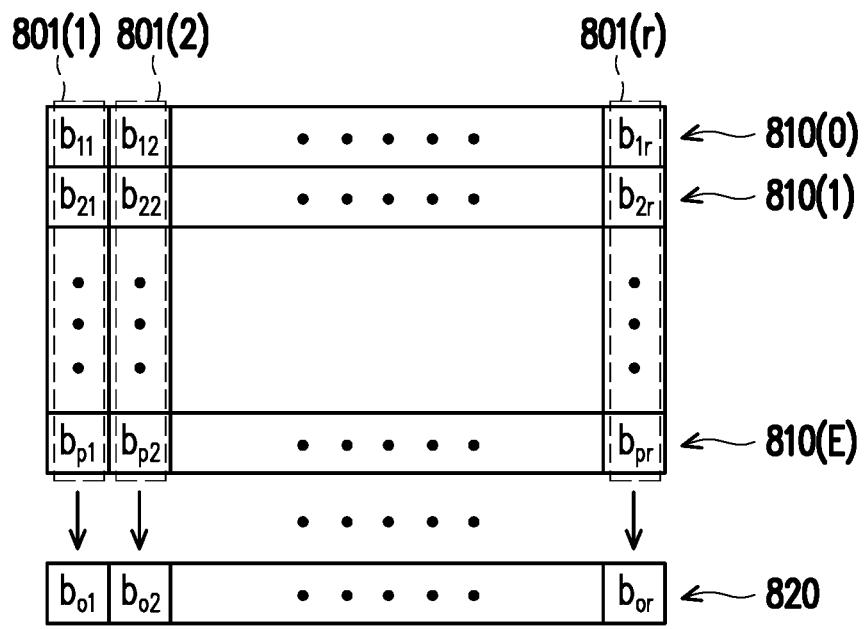
FIG. 12 is a schematic diagram illustrating a multiple-frame encoding according to an embodiment of the present invention.

In this example embodiment, the error detecting and correcting circuit 708 may process a single-frame encoding for the data stored in the same PPU, and it may also process a multiple-frame encoding for the data stored in the plurality of PPUs. The single-frame encoding and the multiple-frame encoding may respectively employ at least one of the encoding algorithms such as a low density parity code (LDPC), a BCH code, a convolutional code, a turbo code, and so on. Alternatively, in an example embodiment, the multiple-frame encoding may also employ a Reed-Solomon codes (RS codes) algorithm or a XOR algorithm. In addition, in another example embodiment, more encoding algorithms not listed above may also be employed, and will not be described here. Based on the encoding algorithm employed, the error detecting and correcting circuit 708 may encode the data to be protected to generate the corresponding error correction code and/or the corresponding error checking code. For convenience of explanation, the error correction code and/or the error checking code generated by the encoding as mentioned below will be collectively referred to as encoding data. FIG. 12 is a schematic diagram illustrating a multiple-frame encoding according to an embodiment of the present invention.

Please refer to FIG. 12, for example, taking to encode the data stored in the PPUs 810(0)~810(E) to generate the corresponding encode data 820 as an example, at least portion data stored in each of the PPUs 810(0)~810(E) may be regarded as a frame. In the multi-frame encoding, the data stored in the PPUs 810(0)-810(E) is encoded based on the location of each bit (or, byte). For example, the bits b11, b21, ..., bp1 at the location 801(1) will be encoded as the bit bo1 in the encode data 820, and the bits b12, b22, ..., bp2 at the location 801(2) will be encoded as the bit bo2 in the encode data 820, and so on. The bits b1r, b2r, ..., bpr at the location 801(r) will be encoded as the bit bor in the encode data 820. Thereafter, the data read from the PPUs 810(0)~810(E) may be decoded based on the encode data 820 to try to correct the error that may exist in the data that is read.

In addition, in another example embodiment in FIG. 12, the data for generating the encode data 820 may also include the redundancy bits corresponding to the data bits in the data stored by the PPUs 810(0)~810(E). Taking the data stored in the PPU 810(0) as an example, the redundancy bits therein are generated, for example, by processing the single-frame encoding on the data bit stored in the PPU 810(0). In this example embodiment, it is assumed that the data read from the PPU 810(0) may firstly use the redundancy bits (e.g. the encode data encoded by the single-frame encoding) in the PPU 810(0) to decode so as to process the error detection and correction when reading the data in the PPU 810(0). However, when the data is decoded by using the redundancy bits in the PPU 810(0) unsuccessfully (e.g. a number of the error bit in the data stored in the PPU 810(0) after decoding is greater than a threshold value), the correct data may be tried to read out from the PPU 810(0) by using the retry-read mechanism. Details about the Retry-read mechanism are detailed later. When the correct data may not be read out from the PPU 810(0) by using the retry-read mechanism, the encode data 820 and the data of the PPUs 810(1)~810(E) can be read, and the encode data 820 and the data of the PPUs 810(1)~810(E) will be decoded to try to correct the error that exists in the data stored in PPU 810(0). That is to say, in this example embodiment, when the encode data generated by using the single-frame encoding is decoded unsuccessfully and when the data is read by using the retry-read mechanism unsuccessfully, it is change to decode the encode data generated by using the multi-frame encoding.

Figure 13:
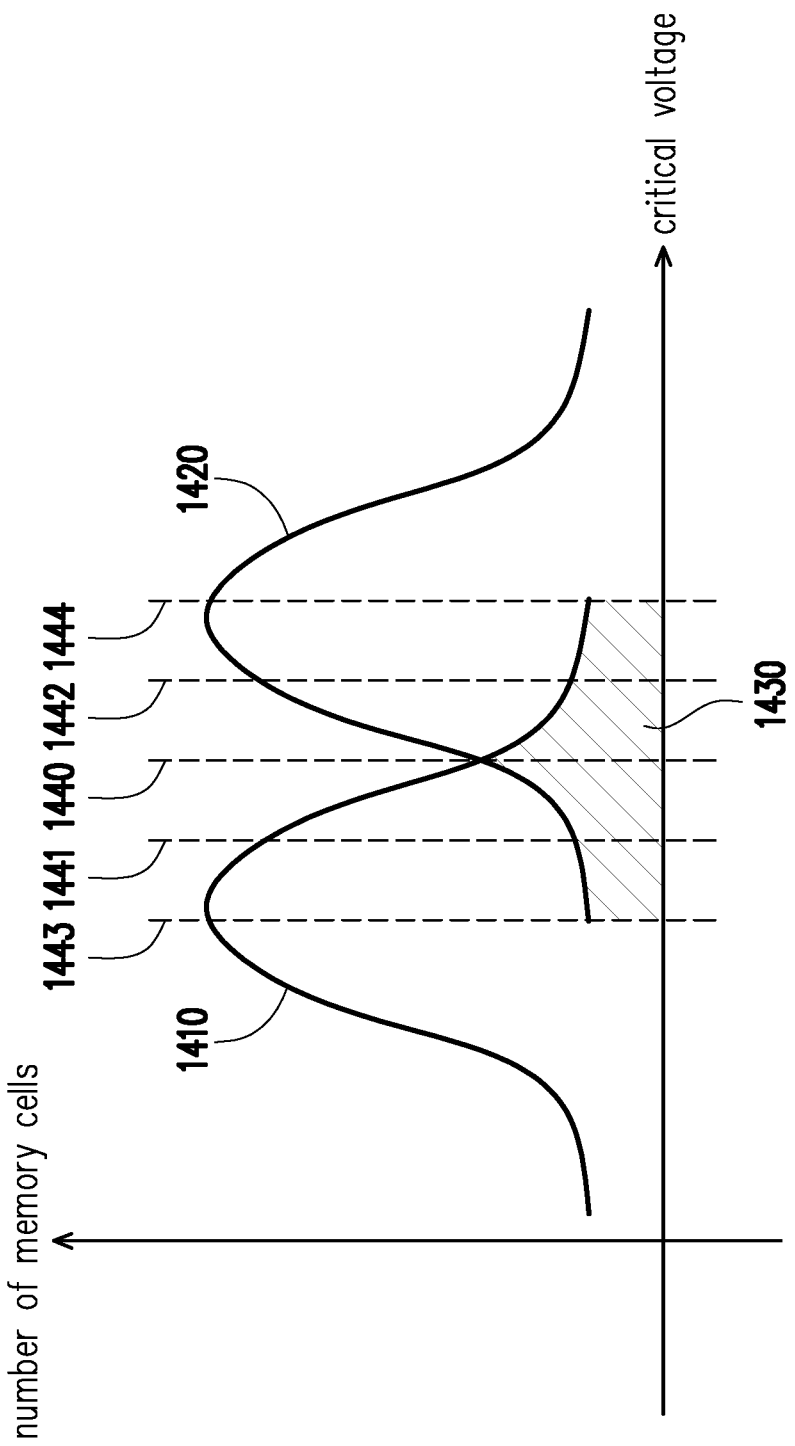
FIG. 13 is a schematic diagram illustrating a retry-read mechanism according to an embodiment.

In particular, FIG. 13 is a schematic diagram illustrating a retry-read mechanism according to an embodiment.

Please refer to FIG. 13, taking the SLC flash memory as an example here, the distribution 1410 and the distribution 1420 are used to indicate the storage state of a plurality of first memory cells, and the distributions 1410 and the distributions 1420 respectively represent the different storage states. These first memory cells may belong to the same PPU or the different PPUs, and the present invention is not limited to this. It is assumed here that when the memory cell belongs to the distribution 1410, the memory cell stores bit "1"; when the memory cell belongs to the distribution 1420, the memory cell stores bit "0". When the MMC 702 reads the memory cell with the reading voltage 1440, the MMC 702 will obtain the verification bit which is configured to indicate whether the memory cell is conducted. It is assumed that the verification bit is "1" when the memory cell is conducted, and vice versa is "0", but the present invention is not limited to this. If the verification bit is "1", then the MMC 702 will determine that the memory cell belongs to the distribution 1410, and vice versa is the distribution 1420. However, the distribution 1410 and the distribution 1420 are overlay in an area 1430. That is, there are several memory cells that should belong to the distribution 1410 but be identified as the distribution 1420, and there are several memory cells that should belong to the distribution 1420 but be identified as the distribution 1410.

In this example embodiment, when the MMC 702 would like to read these memory cells, it may select a default reading voltage (for example, a reading voltage 1441) to read these memory cells firstly to obtain the verification bits of these memory cells. The error detecting and correcting circuit 708 executes a decoding operation based on the verification bits of the memory cells to generate a plurality of decoding bits, and the decoding bits may constitute a decoded data (also referred to as a code word).

If the decoding is unsuccessful, it means that the error bits that cannot be corrected are stored in these memory cells. If the decoding is unsuccessful, in the retry-read mechanism, the MMC 702 will re-obtain another reading voltage and read these first memory cells by using the another reading voltage (for example, a reading voltage 1442) to re-obtain the verification bits of the memory cells. The MMC 702 executes the decoding operation as mentioned above based on the re-obtained verification bits to obtain another decoded data composed of a plurality of decoded bits. In an example embodiment, the error detecting and correcting circuit 708 determines whether another decoded data is a valid code word based on the syndrome corresponding to the another decoded data. If the another decoded data is not a valid code word, the MMC 702 determines that the decoding is unsuccessful. If the number that the reading voltages re-obtained is not more than the preset number of times, the MMC 702 will re-obtain the other reading voltage (e.g. a reading voltage 1443) again and re-obtain the memory cell based on the reading voltage 1443 that is re-obtained to re-obtain the verification bits and execute the first decoding operations.

In other words, when there is the error bit that cannot be corrected, the verification bits of the some memory cells are changed by re-obtaining the reading voltage, thereby there is a chance to change the decoding result of the decoding operation. Theoretically, the abovementioned action of re-obtaining the reading voltage is to flip several bits in one code word and re-decode the new code word. In the case of some, the code word that cannot be decoded before flipping (with error bit that cannot be corrected) may be decoded after flipping. Also, in an example embodiment, the MMC 702 will attempt to decode several times until the number of attempting exceeds the preset number of times. However, the present invention does not limit the number of presets.

It should be noted that the decoding operation that is executed by using the encode data generated by the single-frame encoding can be divided into a hard bit mode decoding and a soft bit mode decoding. Both in the processes of the hard bit mode decoding and the soft bit mode decoding, the encode data is decoded based on the "decoding initial value" of the memory cell. In the process of the hard bit mode decoding, the decoding initial value of the memory cell is divided into two values (e.g. n and −n) based on one verification bit. For example, if the verification bit is "1", the MMC 702 may set the decoding initial value corresponding the memory cell as −n; if the verification bit is "0", the decoding initial value may be set as n. Wherein n is a positive integer, but the present invention does not limit the value of the positive integer n. That is to say, an iterative decoding executed based on two values (e.g. n and −n) is also referred to as the hard bit mode decoding. However, the above step for changing the reading voltage may also be applied to the soft bit mode decoding, wherein the decoding initial value of each memory cell is determined based on the plurality of verification bits. It is worth noting that whether it is the hard bit mode or the soft bit mode, the probability value of the bit is calculated in the iterative decoding, so it is a probability decoding algorithm. The detailed executing process of the hard bit mode decoding and the soft bit mode decoding may be known from the prior art, and will not be described here.

It is worth noting that the example shown in FIG. 13 is the SLC flash memory, but the step of re-obtaining the reading voltage may also be applied to MLC or TLC flash memory. As shown in FIG. 8, changing the reading voltage VA will flip the LSB of one memory cell, and changing the reading voltage VB or VC will flip the MSB of one memory cell. Therefore, changing the reading voltage VA, VB or VC will change one code word to another code word. The result of changing the code word also applies to the TLC flash memory in FIG. 9. The present invention does not limit the use of the SLC, MLC or TLC flash memory. It should be noted that the reading voltages VA~VC can be collectively referred to as a reading voltage group. For example, the MMC 702 may select a certain reading voltage group from the plurality of reading voltage groups to read the memory cell.

It should be noted that, in this embodiment, when a PPU in the RNVM module 406 is read, the MMC 702 firstly uses a default voltage group to read the PPU and executes the hard bit mode decoding based on the data that is read out by using the PPU. When the decoding is unsuccessful, the aforementioned retry-read mechanism is executed to execute the hard bit mode decoding again. When the retry-read mechanism fails to read, the MMC 702 may execute the soft bit mode decoding. When the soft bit mode decoding is unsuccessful, the MMC 702 will change to use the encode data generated by multiple-frame encoding to decode.

It should be noted that when a decoding operation is executed for the data read out by a read command but a decoding is unsuccessful then a decoding operation (e.g. a retry-read mechanism) is repeatedly executed, all subsequent read commands of the read command are forced to wait and not executed, which will result in worse executing efficiency for reading the commands.

Therefore, The present invention provides a decoding method, when a read command (also known as a first read command) is configured to read out the data from a PPU (also known as a first PPU), the MMC 702 will firstly suspend executing the decoding of the data read out from the first PPU and will firstly execute the subsequent other commands (e.g. read commands) of the first read command if a portion of a retry-read mechanism executed is unsuccessful during the process of reading. After the subsequent other commands are executed, the MMC 702 will return to execute reading based on the first read command and execute another portion of the retry-read mechanism for the data read out by the first read command.

In more detail, FIG. 14 is a schematic diagram illustrating a plurality of reading voltage groups for the retry-read mechanism according to an embodiment. Please refer to FIG. 14, it is assumed that MMC 702 receives the plurality of commands from the host system 11. It is assumed here that these commands include a first read command, and all the other commands other than the first read command are also read commands. However, in other embodiment, the abovementioned other commands other than the first read command may also be other command (for example, a write command, an erasing command, a garbage collection command, a block loss balance command, and so on, and the present invention does not limit this). It is assumes that the first read command of the read commands is configured to read the first PPU. Firstly, the MMC 702 will read the first PPU by using the default voltage group (not shown) and execute the hard bit mode decoding based on the data read out by using the default voltage group. When the decoding fails, the MMC 702 may execute the retry-read mechanism to select the reading voltage group G1 as shown in FIG. 14 and read the first PPU based on the reading voltage V1~V1N of the reading voltage group G1 to obtain the data read by using the reading voltage V1~V1N. After that, the MMC 702 executes the hard bit mode decoding again for the data read out by using the reading voltage V1~V1N.

When executing the hard bit mode decoding for the data read out by using the reading voltage V1~V1N fails, the MMC 702 may execute the retry-read mechanism to select the reading voltage group G2 as shown in FIG. 14 and read the first PPU based on the reading voltage V2~V2N of the reading voltage group G2 to obtain the data read out by using the reading voltage V2~V2N. After that, the MMC 702 executes the hard bit mode decoding again for the data read out by using the reading voltage V2~V2N.

When executing the hard bit mode decoding for the data read out by using the reading voltage V2~V2N fails, the MMC 702 may select the reading voltage group G3 as shown in FIG. 14 and read the first PPU based on the reading voltage V3~V3N of the reading voltage group G3 to obtain the data read out by using the reading voltage V3~V3N. After that, the MMC 702 executes the hard bit mode decoding again for the data read out by using the reading voltage V3~V3N.

When executing the hard bit mode decoding for the data read out by using the reading voltage V3~V3N fails, the MMC 702 may execute the retry-read mechanism again to select the reading voltage group G4 as shown in FIG. 14 and read the first PPU based on the reading voltage V4~V4N of the reading voltage group G4 to obtain the data read out by using the reading voltage V4~V4N. After that, the MMC 702 executes the hard bit mode decoding again for the data read out by using the reading voltage V4~V4N.

When it is failure that to execute the hard bit mode decoding for the data read out by using the reading voltage V4~V4N, the MMC 702 may execute the retry-read mechanism again to select the reading voltage group G5 as shown in FIG. 14 and read the first PPU based on the reading voltage V5~V5N of the reading voltage group G4 to obtain the data read out by using the reading voltage V5~V5N. After that, the MMC 702 executes the hard bit mode decoding again for the data read out by using the reading voltage V5~V5N.

When executing the hard bit mode decoding for the data read out by using the reading voltage V5~V5N fails, the MMC 702 will suspend executing the aforementioned first read command at this time and execute at least one other command (also known as a first other command) being different from the first read command subsequent to the first read command. In this embodiment, a number of the first other command is, for example, three. In this embodiment, it is assumed that the sorting of the first read command is the 1st of all commands, the sorting of the aforementioned first other commands are the 2nd, 3rd and 4th of all commands. However, the present invention is not used to limit the number of first other command.

It should be noted that the aforementioned reading voltage groups G1~G5 may be collectively referred to as "first reading voltage group". The data that is read out from the first PPU and configured to execute the hard bit mode decoding by using reading voltage groups G1~G5 can be collectively referred to as "first data". The operation of the hard bit mode decoding can be referred to as "first decoding operation." It should be noted that the number of the first reading voltage group is five in this embodiment. However, in the preferred embodiment, the number of the first reading voltage group is greater than or equal to five and less than or equal to ten.

It is assume that after the first other command is executed successfully, the MMC 702 will return to execute the first read command. In more detail, the MMC 702 may continue to execute the retry-read mechanism that has not yet finished executing to select the reading voltage group G6 as shown in FIG. 14, and read the first PPU based on the reading voltage in the reading voltage group G6 and execute the hard bit mode decoding again based on the reading data.

When decoding the data read out by using the reading voltage group G6 fails, the MMC 702 will execute the retry-read mechanism again. It is assumed that failures are occurred when the MMC 702 executes the hard bit mode decoding for the data (also known as second data) read out by using the reading voltage group G7~G10 (not shown) in the subsequent retry-read mechanism, the MMC 702 may suspend executing the aforementioned first read command and execute at least one second other command subsequent to the first other command. In this embodiment, a number of the second other command is, for example, three. In this embodiment, it is assumed that the first other command are the 2nd, 3rd and 4th commands sorted in all commands, so the second other command are the 5th, 6th and 7th commands sorted in all commands. In addition, the reading voltage group G6~G10 may be collectively referred to as "second reading voltage group". It should be noted here that first other command and the second other command can be collectively referred to as "other commands being different from the first read command".

It is assumed that after the second other command is successfully executed, the MMC 702, for example, determines whether the number of the commands that are successfully executed subsequent to the first read command (that is, the number of the executed other command being different from the first read command) has reached the threshold value. When the number of the executed other commands being different from the first read command is not greater than the threshold value and failures are occurred when the MMC 702 executes a portion of the retry-read mechanism again, the MMC 702 may firstly suspend executing the first read command again and firstly execute a plurality of commands subsequent to the abovementioned second other command.

However, when the number of the executed other commands being different from the first read command is greater than the threshold value, the MMC 702 returns to execute the first read command so that the complete decoding process (e.g. the remaining unexecuted retry-read mechanism and soft bit mode decoding) is executed completely. In more detail, the MMC 702 will continue to execute the retry-read mechanism that has not yet finished executing based on the first read command to select the reading voltage group G11 (not shown) as shown in FIG. 14, and read the first PPU based on the reading voltage of the reading voltage group G11 and execute the hard bit mode decoding again based on the data read out. When decoding the data read out by using the reading voltage group G11 fails, the MMC 702 executes the retry-read mechanism again. It is assumed that failures are occurred when the MMC 702 executes the hard bit mode decoding for the data read out by using the reading voltage group G12 (not shown)~Gx, the MMC 702 may not suspend executing the aforementioned first read command but execute the soft bit mode decoding (also known as second decoding operation) based on the first read command in the subsequent retry-read mechanism. In more detail, the MMC 702 may read the first PPU by using other reading voltage groups (not shown) to obtain the data (also referred to as fourth data), and execute the soft bit mode decoding for the fourth data.

It should be noted that the data read by the reading voltage group G11~Gx may be collectively referred to as "third data".

Figure 15:
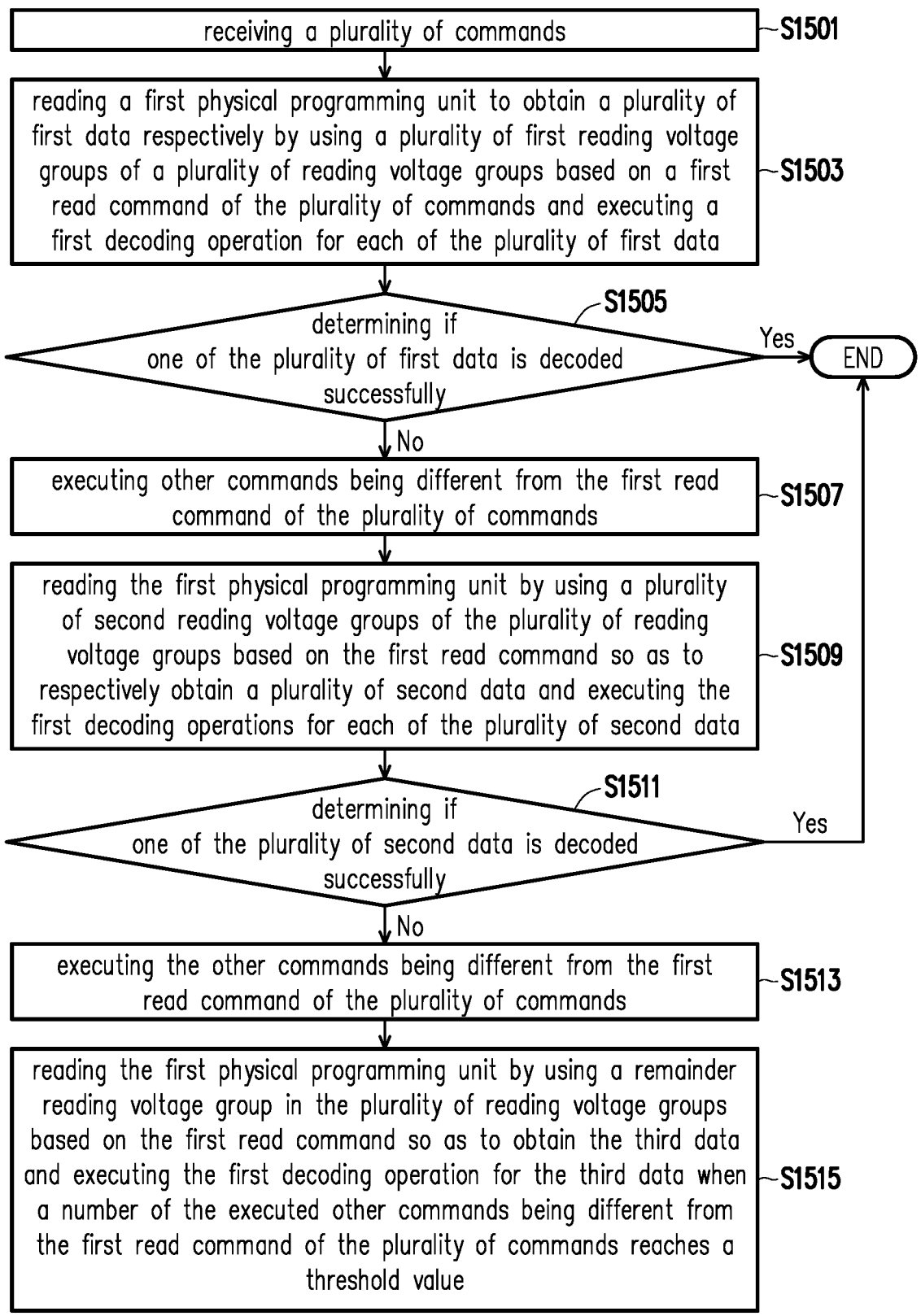
FIG. 15 is a flow chart diagram illustrating a decoding method according to an embodiment.

FIG. 15 is a flow chart diagram illustrating a decoding method according to an embodiment.

Please refer to FIG. 15. In step S1501, the MMC 702 receives a plurality of commands. In step S1503, the MMC 702 reads a first PPU to obtain a plurality of first data respectively by using a plurality of first reading voltage groups of a plurality of reading voltage groups based on a first read command of the plurality of commands as mentioned above and executes a first decoding operation for each of the plurality of first data. In step S1505, the MMC 702 determines whether one of the plurality of first data is successfully decoded. When one of the plurality of first data is successfully decoded, the flow in FIG. 15 is ended. When the first decoding operation is unsuccessfully executed for each of the plurality of first data, in step S1507, the MMC 702 executes the other commands being different from the first read command of the plurality of commands. Afterwards, after the other commands being different from the first read command are executed, in step S1509, the MMC 702 reads the first PPU by using a plurality of second reading voltage groups of the plurality of reading voltage groups based on the first read command so as to respectively obtain a plurality of second data and executes the first decoding operations for each of the plurality of second data. In step S1511, the MMC 702 determines whether one of the plurality of second data is successfully decoded. When one of the plurality of second data is successfully decoded, the flow in FIG. 15 is ended. When the first decoding operation is unsuccessfully executed for each of the plurality of second data, in step S1513, the MMC 702 executes the other commands being different from the first read command of the plurality of commands. Then in step S1515, when a number of the executed other commands being different from the first read command of the plurality of commands reaches a threshold value, the MMC 702 reads the first PPU by using a remainder reading voltage group in the plurality of reading voltage groups based on the first read command so as to obtain the third data and executes the first decoding operation for the third data.

In summary, the decoding method, the memory controlling circuit unit and the memory storage device of the present invention may firstly suspend executing the decoding corresponding to a read command and firstly execute other commands subsequent to the read command so as to reduce the waiting time that the subsequent commands wait the previous read command to execute the complete decoding operation.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A decoding method for a rewritable non-volatile memory, the rewritable non-volatile memory having a plurality of physical erasing units, each of the plurality of physical erasing units having a plurality of physical programming units, the decoding method comprising:

receiving a plurality of commands;

reading a first physical programming unit to obtain a plurality of first data respectively by using a plurality of first reading voltage groups of a plurality of reading voltage groups based on a first read command of the plurality of commands and executing a first decoding operation for each of the plurality of first data, wherein the number of the plurality of first reading voltage groups is less than the number of the plurality of reading voltage groups;

suspending the first decoding operation and the first read command and executing other commands being different from the first read command of the plurality of commands based on information indicating that the first decoding operation for all of the plurality of first data is unsuccessful;

reading the first physical programming unit to obtain a plurality of second data respectively by using a plurality of second reading voltage groups of the plurality of reading voltage groups based on the first read command and executing the first decoding operation for each of the plurality of second data, wherein the number of the plurality of second reading voltage groups is less than the number of the plurality of reading voltage groups, and the plurality of second reading voltage groups are different from the plurality of first reading voltage groups;

executing the other commands being different from the first read command of the plurality of commands based on information indicating that the first decoding operation for all of the plurality of second data is unsuccessful;

reading the first physical programming unit to obtain at least one third data by using at least one remainder reading voltage group other than the plurality of first reading voltage groups and the plurality of second reading voltage groups of the plurality of reading voltage groups based on the first read command of the plurality of commands and returning to execute the first decoding operation for the at least one third data when the number of the executed other commands being different from the first read command of the plurality of commands reaches a threshold value; and reading the first physical programming unit to obtain a fourth data and executing a second decoding operation for the fourth data based on information indicating that the first decoding operation for the third data is unsuccessful, wherein the first decoding operation is a hard bit mode decoding operation, and the second decoding operation is a soft bit mode decoding operation.

2. The decoding method according to claim 1, wherein the number of the plurality of first reading voltage groups is greater than or equal to five, and the number of the plurality of first reading voltage groups is less than or equal to ten.

3. The decoding method according to claim 1, wherein the number of the other commands being different from the first read command is three.

4. The decoding method according to claim 1, wherein the other commands being different from the first read command are read commands.

5. A memory controlling circuit for a rewritable non-volatile memory, the rewritable non-volatile memory having a plurality of physical erasing units, each of the plurality of physical erasing units having a plurality of physical programming units, the memory controlling circuit comprising:

19 a host interface configured to couple to a host system;
a memory interface configured to couple to the rewritable non-volatile memory; and
a memory management circuit coupled to the host interface and the memory interface,
wherein the memory management circuit is configured to receive a plurality of commands,
wherein the memory management circuit is further configured to read a first physical programming unit to obtain a plurality of first data respectively by using a plurality of first reading voltage groups of a plurality of reading voltage groups based on a first read command of the plurality of commands and execute a first decoding operation for each of the plurality of first data, wherein the number of the plurality of first reading voltage groups is less than the number of the plurality of reading voltage groups,
the memory management circuit is further configured to suspend the first decoding operation and the first read command and execute other commands being different from the first read command of the plurality of commands based on information indicating that the first decoding operation for all of the plurality of first data is unsuccessful,
the memory management circuit is further configured to read the first physical programming unit to obtain a plurality of second data respectively by using a plurality of second reading voltage groups of the plurality of reading voltage groups based on the first read command and execute the first decoding operation for each of the plurality of second data,
wherein the number of the plurality of second reading voltage groups is less than the number of the plurality of reading voltage groups, and the plurality of second reading voltage groups are different from the plurality of first reading voltage groups,
wherein the memory management circuit executes the other commands being different from the first read command of the plurality of commands based on information indicating that the first decoding operation for all of the plurality of second data is unsuccessful,
wherein the memory management circuit further reads the first physical programming unit to obtain at least one third data by using at least one remainder reading voltage group other than the plurality of first reading voltage groups and the plurality of second reading voltage groups of the plurality of reading voltage groups based on the first read command of the plurality of commands and returns to execute the first decoding operation for the at least one third data when the number of the executed other commands being different from the first read command of the plurality of commands reaches a threshold value, and
wherein the memory management circuit further reads the first physical programming unit to obtain a fourth data and executes a second decoding operation for the fourth data based on information indicating that the first decoding operation for the third data is unsuccessful, wherein the first decoding operation is a hard bit mode decoding operation, and the second decoding operation is a soft bit mode decoding operation.

6. The memory controlling circuit according to claim 5, wherein the number of the plurality of first reading voltage groups is greater than or equal to five and the number of the plurality of first reading voltage groups is less than or equal to ten.

20

7. The memory controlling circuit according to claim 5, wherein the number of the other commands being different from the first read command is three.

8. The memory controlling circuit according to claim 5, wherein the other commands being different from the first read command are read commands.

9. A memory storage device, comprising:
a connection interface circuit configured to couple to a host system;
a rewritable non-volatile memory having a plurality of physical erasing units, each of the plurality of physical erasing units having a plurality of physical programming units; and
a memory controlling circuit coupled to the connection interface circuit and the rewritable non-volatile memory,
wherein the memory controlling circuit is configured to receive a plurality of commands,
wherein the memory controlling circuit is further configured to read a first physical programming unit to obtain a plurality of first data respectively by using a plurality of first reading voltage groups of a plurality of reading voltage groups based on a first read command of the plurality of commands and execute a first decoding operation for each of the plurality of first data, wherein the number of the plurality of first reading voltage groups is less than the number of the plurality of reading voltage groups,
the memory controlling circuit further configured to suspend the first decoding operation and the first read command and execute other commands being different from the first read command of the plurality of commands based on information indicating that the first decoding operation for all of the plurality of first data is unsuccessful,
the memory controlling circuit is further configured to read the first physical programming unit to obtain a plurality of second data respectively by using a plurality of second reading voltage groups of the plurality of reading voltage groups based on the first read command and execute the first decoding operation for each of the plurality of second data, wherein the number of the plurality of second reading voltage groups is less than the number of the plurality of reading voltage groups, and the plurality of second reading voltage groups are different from the plurality of first reading voltage groups,
the memory controlling circuit executes the other commands being different from the first read command of the plurality of commands based on information indicating that the first decoding operation for all of the plurality of second data,
the memory controlling circuit further reads the first physical programming unit to obtain at least one third data by using at least one remainder reading voltage group except the plurality of first reading voltage groups and the plurality of second reading voltage groups of the plurality of reading voltage groups based on the first read command of the plurality of commands and returns to execute the first decoding operation for the at least one third data when the number of the other commands being executed being different from the first read command of the plurality of commands reaches a threshold value,
the memory controlling circuit further reads the first physical programming unit to obtain a fourth data and executes a second decoding operation for the fourth data based on information indicating that the first decoding operation for the third data is unsuccessful, wherein the first decoding operation is a hard bit mode decoding operation, and the second decoding operation is a soft bit mode decoding operation.

10. The memory storage device according to claim 9, wherein the number of the plurality of first reading voltage groups is greater than or equal to five and the number of the plurality of first reading voltage groups is less than or equal to ten.

11. The memory storage device according to claim 9, wherein the number of the other commands being different from the first read command is three.

12. The memory storage device according to claim 9, wherein the other commands being different from the first read command are read commands.

* * * * *